(12) United States Patent
Silberman

(10) Patent No.: US 9,455,746 B2
(45) Date of Patent: Sep. 27, 2016

(54) VARIABLE SPEED CHIEN SEARCH ARCHITECTURE

(71) Applicant: NetApp, Inc., Sunnyvale, CA (US)

(72) Inventor: Joshua Silberman, Redwood City, CA (US)

(73) Assignee: NetApp, Inc., Sunnyvale, CA (US)

(*) Notice: Subject to any disclaimer, the term of this patent is extended or adjusted under 35 U.S.C. 154(b) by 182 days.

(21) Appl. No.: 14/143,203

(22) Filed: Dec. 30, 2013

(65) Prior Publication Data

US 2015/0188572 A1 Jul. 2, 2015

(51) Int. Cl.
*H03M 13/00* (2006.01)
*H03M 13/15* (2006.01)

(52) U.S. Cl.
CPC ................ *H03M 13/1545* (2013.01)

(58) Field of Classification Search
CPC ................................. H03M 13/1545
See application file for complete search history.

(56) References Cited

U.S. PATENT DOCUMENTS

| | | | |
|---|---|---|---|
| 2010/0107039 A1* | 4/2010 | Toda | 714/764 |
| 2010/0241932 A1* | 9/2010 | Sakaue et al. | 714/784 |
| 2011/0055668 A1* | 3/2011 | Kim et al. | 714/782 |

\* cited by examiner

*Primary Examiner* — Guy Lamarre
(74) *Attorney, Agent, or Firm* — LeClairRyan, a Professional Corporation

(57) ABSTRACT

Examples are disclosed for using or designing Chien search circuitry to locate errors for error correction code (ECC) encoded data. In some examples, an error locator polynomial (ELP) may be received that indicates a number of possible error locations for ECC encoded data. Chien search circuitry may be designed such that error locations are found based on the received ELP within one or more passes through the search circuitry. The design of the Chien search circuitry to accommodate both an average expected number of error locations for received ELPs and a worst case number of error locations for received ELPs. Other examples are described and claimed.

12 Claims, 9 Drawing Sheets

800

> DETERMINE, FOR A MEMORY SYSTEM, A WORST CASE NUMBER OF ERRORS FOR ECC ENCODED DATA FOR WHICH A CHIEN SEARCH CIRCUIT ASSOCIATED WITH A DECODER FOR THE MEMORY SYSTEM IS TO LOCATE ERRORS BASED ON A RECEIVED ELP HAVING A DEGREE T THAT INDICATES ERROR LOCATIONS FOR THE WORST CASE NUMBER OF ERRORS
> 802

> DETERMINE AN AVERAGE EXPECTED NUMBER OF ERRORS FOR THE ECC ENCODED DATA THAT IS A FRACTION OF T
> 804

> MODEL A DESIGN FOR THE CHIEN SEARCH CIRCUIT BASED ON VARIOUS GALOIS FIELD CONSTANTS THAT ARE TO BE USED BY THE CHIEN SEARCH CIRCUIT TO IDENTIFY FIRST ROOTS FOR A FIRST RECEIVED ELP HAVING A FIRST DEGREE THAT EQUALS THE FRACTION OF T TO LOCATE ERRORS FOR THE AVERAGE EXPECTED NUMBER OF ERRORS IN A SINGLE PASS THROUGH THE CHIEN SEARCH CIRCUIT AND TO IDENTIFY SECOND ROOTS FOR A SECOND RECEIVED ELP HAVING THE DEGREE T TO LOCATE ERRORS FOR THE WORST CASE NUMBER OF ERRORS IN MULTIPLE PASSES THROUGH THE CHIEN SEARCH CIRCUIT
> 806

*FIG. 8*

Storage Medium 900

*Computer Executable Instructions for 800*

*FIG. 9*

Computing Platform 1000

Processing Component 1040

Apparatus 700

Storage Medium 900

Other Platform Components 1050

Communications Interface 1060

*FIG. 10*

VARIABLE SPEED CHIEN SEARCH ARCHITECTURE

BACKGROUND

An error correction code (ECC) may be used to protect data or recover from errors related to a medium via which the data was either transmitted or stored. For example, data may be encoded using an ECC to possibly recover from errors associated with wired/wireless communications, storage to memory devices/mediums or optical readers such as 2-dimensional bar code readers. ECC encoded data received by either reading data from a memory device/medium or barcode or received via a wired/wireless communication channel may be able to identify and correct a given number of errors. Typically, ECC encoded data may include codewords having a combination of data and redundant or parity bits or symbols. Depending on the size of a given codeword and the level of protection desired, codewords may vary in size and also may vary in the complexity of algorithms used to recover from possible errors.

Errors in a given period of time may be referred to as a bit error rate (BER). Technological advances in digital signal transmissions that have greatly increased data transmission speeds have also increased the possibility of a higher BER. Also, memory storage/medium technologies have resulted in increasingly denser storage that may also lead to an increased possibility of a higher BER. In order to reduce the impacts of possibly higher BERs, data may be encoded in larger codewords. These larger codewords may have more parity bits. Large codewords with more parity bits may require complex algorithms implemented with increasing amounts of computing resources.

BRIEF DESCRIPTION OF THE DRAWINGS

FIG. 8 illustrates an example logic flow.
FIG. 9 illustrates an example storage medium.
FIG. 10 illustrates an example computing platform.

DETAILED DESCRIPTION

As contemplated in the present disclosure, large codewords with more parity bits may require complex algorithms implemented with increasing amounts of computing resources in order to reduce BERs. In some examples, a substantial amount of computing resources in a decoder for ECC encoded data may be directed to circuitry arranged to locate errors in the ECC encoded data. A particular type of circuitry for locating errors that may be used is known as a Chien search circuit. Typically, a Chien search circuit may find error locations when the ECC used to encode the data is Reed-Solomon (RS) codes or binary Bose, Chaudhuri, and Hocquenghem (BCH) codes. Also, a Berlekamp-Massey algorithm (BMA) may be implemented by computing resources to generate error location polynomials (ELPs) that are then evaluated by the Chien search circuit to identify roots to the ELPs that identify error location(s).

A substantial amount of complexity and computing resources may be attributed to Chien search circuits that may be arranged to find roots to ELPs. These roots are typically found by exhaustive search of all potential values. Large codewords having more parity bits may result in ELPs having increasingly higher numbers of potential values to search to find roots.

Typically Chien search circuits may be designed to find all possible roots and thus locate errors for a worst case. In other words, the larger the codeword having more parity bits to protect data from errors, the larger the Chien search circuit may be. However, depending on the usage case for ECC encoded data, a large percentage of errors for the ECC encoded data may be far below the worst case. Since Chien search circuits need to identify error locations quickly, they are typically implemented almost entirely in hardware. Also, even if a give ELP indicates only a few errors, Chien search circuits are typically designed to use the same amount of computing resources regardless of the number of errors identified in the ELP. As a result, computing resources may be needlessly wasted and decoding of ECC encoded data may be longer than necessary. It is with respect to these and other challenges that the examples described herein are needed.

In some examples, a variable speed Chien search architecture may be designed and/or used to locate errors in ECC encoded data. For example, an ELP may be received at circuitry for a memory system (e.g., a memory controller). The ELP may have a given degree that indicates a maximum number of error locations for the ECC encoded data. A determination may then be made as to whether a Chien search circuit designed according to the variable Chien search architecture is capable of finding the maximum number of error locations indicated by the ELP in a single pass through a plurality of processing units included in the Chien search circuit. Roots for the ELP may then be found in the single pass or in a plurality of passes based on the determination.

Figure 1:
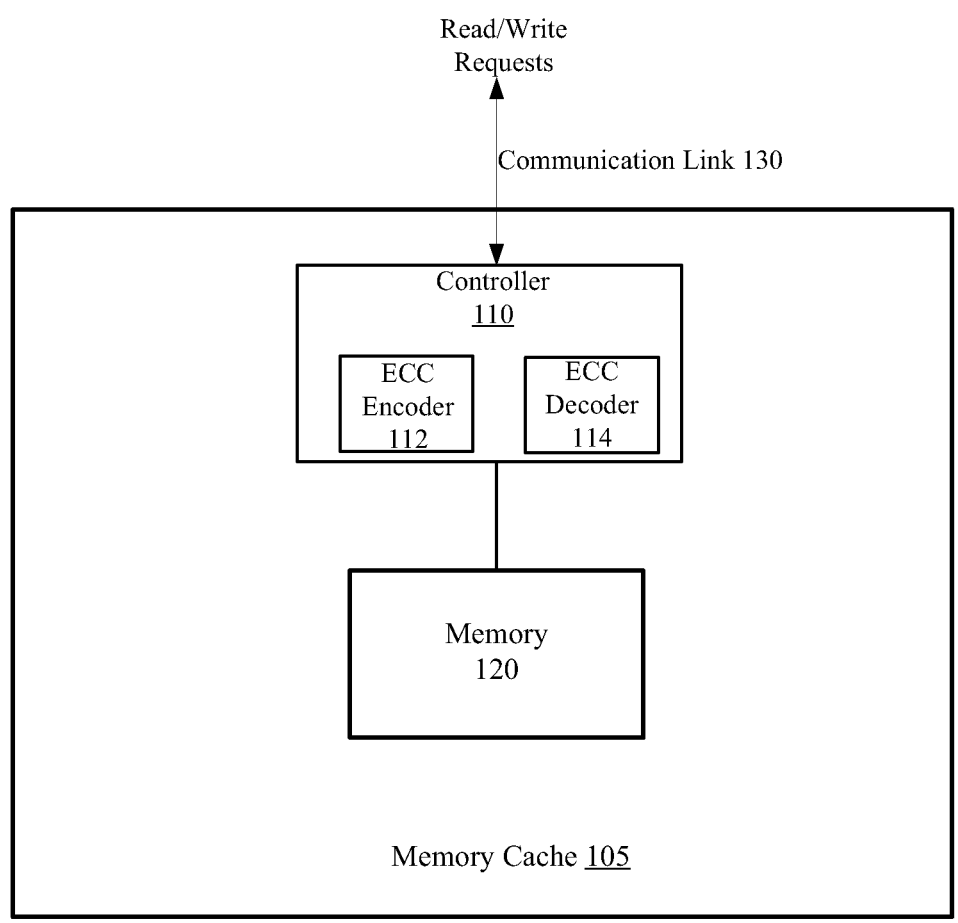
FIG. 1 illustrates an example first system.

FIG. 1 illustrates an example first system. As shown in FIG. 1, the first system includes memory cache 105. In some examples, memory cache 105 may include a controller 110 and a memory 120. According to some examples, controller 110 may receive and/or fulfill read/write requests via communication link 130. Although not shown in FIG. 1, in some examples, communication link 130 may communicatively couple controller 110 to elements or features associated with an operating system for a computing device such as a storage server. For these examples, memory cache 105 may function as a memory cache for the computing device.

In some examples, as shown in FIG. 1, controller 110 may include an error correction code (ECC) encoder 112 and an ECC decoder 114. ECC encoder 112 may include logic and/or features to generate codewords to protect data to be written to memory 120. As described in more detail below, ECC decoder 114 may include logic and/or features to detect, locate and possibly correct errors included in ECC encoded data. According to some examples, the ECC used to encode the data may include, but is not limited to, RS codes or BCH codes.

In some examples, memory 120 may include non-volatile and/or volatile types of memory. Non-volatile types of memory may include, but are not limited to, flash memory, ferroelectric memory, phase change memory (PCM), silicon-oxide-nitride-oxide-silicon (SONOS) memory, polymer memory such as ferroelectric polymer memory, nanowire, ferroelectric transistor random access memory (FeTRAM or FeRAM), ovonic memory, nanowire or electrically erasable programmable read-only memory (EEPROM). Volatile types of memory may include, but are not limited to, dynamic random access memory (DRAM) or static RAM (SRAM).

In some examples, memory 120 may also include types of storage mediums such as optical discs to include, but not limited to, compact discs (CDs), digital versatile discs (DVDs), a high definition DVD (HD DVD) or a Blu-ray disc.

Figure 2:
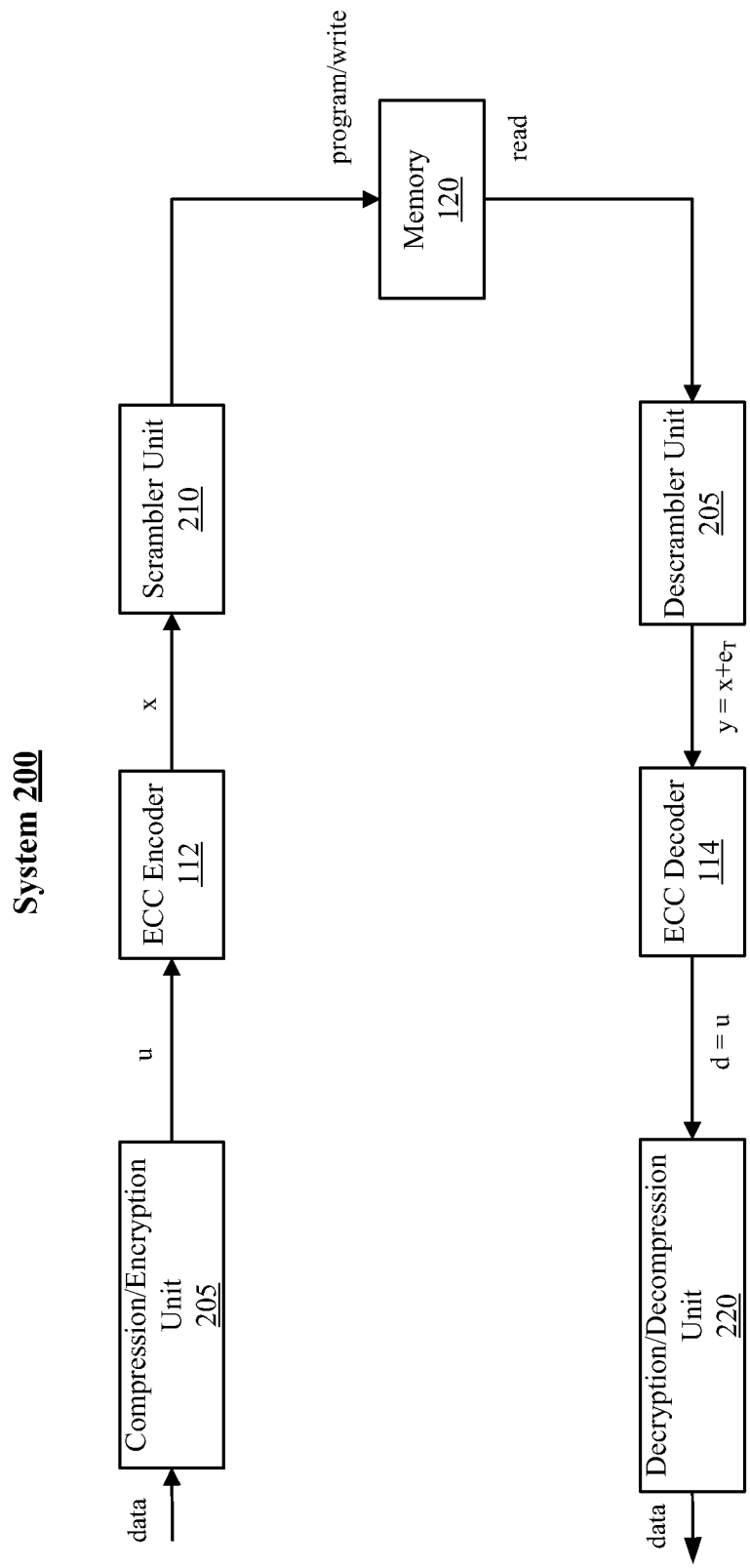
FIG. 2 illustrates an example second system.

FIG. 2 illustrates an example second system. As shown in FIG. 2, the example second system includes system 200. In some examples, system 200 includes a compression/encryption unit 205, ECC encoder 112, a scrambler unit 210, memory 120, a descrambler unit 205, ECC decoder 114 and a decryption/decompression unit 220.

According to some examples, as shown in FIG. 2, compression/encryption of data at compression/encryption unit 205 may result in "u". ECC encoder 112 may receive u and generate a codeword "x" using an ECC code (e.g., using BCH or RS codes). Scrambler unit 210 may receive x and cause x to be programmed or written to memory 120. The codeword may be read from memory 120 and descrambled by descrambler unit 205 to result in a codeword "y". As shown in FIG. 2, y=x+$e_T$, where "$e_T$" represents errors possibly introduced during the writing then reading of x from memory 120 and "T" represents a maximum number of possible error locations for errors introduced during the writes and reads from memory 120. ECC decoder 114 may receive y and possibly correct identified errors to generate "d". As shown in FIG. 2, if the errors were correctable, d=u. Decryption/Decompression unit 220 may then decrypt/decompress u to generate data originally compressed/encrypted by compression/encryption unit 205.

In some examples, ECC decoder 114 may include logic and/or features to receive ECC encoded data y having $e_T$. ECC decoder 114 may generate an error locator polynomial (ELP) with a given degree T that indicates $e_T$. ECC decoder 114 may include logic and/or features to determine whether circuitry included in ECC decoder 114 (e.g., a Chien search circuit) is capable of finding error locations for ECC encoded data y having $e_T$ in single pass through the circuitry or in multiple passes. Roots for the ELP with the given degree T may then be found based on the determination and those roots may be used to locate the errors indicated by the ELP.

According to some examples, determining whether the circuitry is capable of locating errors in a single pass or multiple pass for ECC encoded data y having $e_T$ may allow for a type of variable speed search architecture. As described in more detail below, the variable search architecture may be based on a Chien search circuit arranged to locate errors in either single or multiple passes. As mentioned previously, average expected errors for ECC encoded data may be substantially below worst case errors. As a result, most errors locations may be identified in a single pass through the circuitry that may use only a few processor clock cycles to complete and may be a relatively fast search. However, in some cases a large number of errors may occur that may require multiple passes through the circuitry requiring a large number of processor clock cycles and thus may be a relatively slow search.

Figure 3:
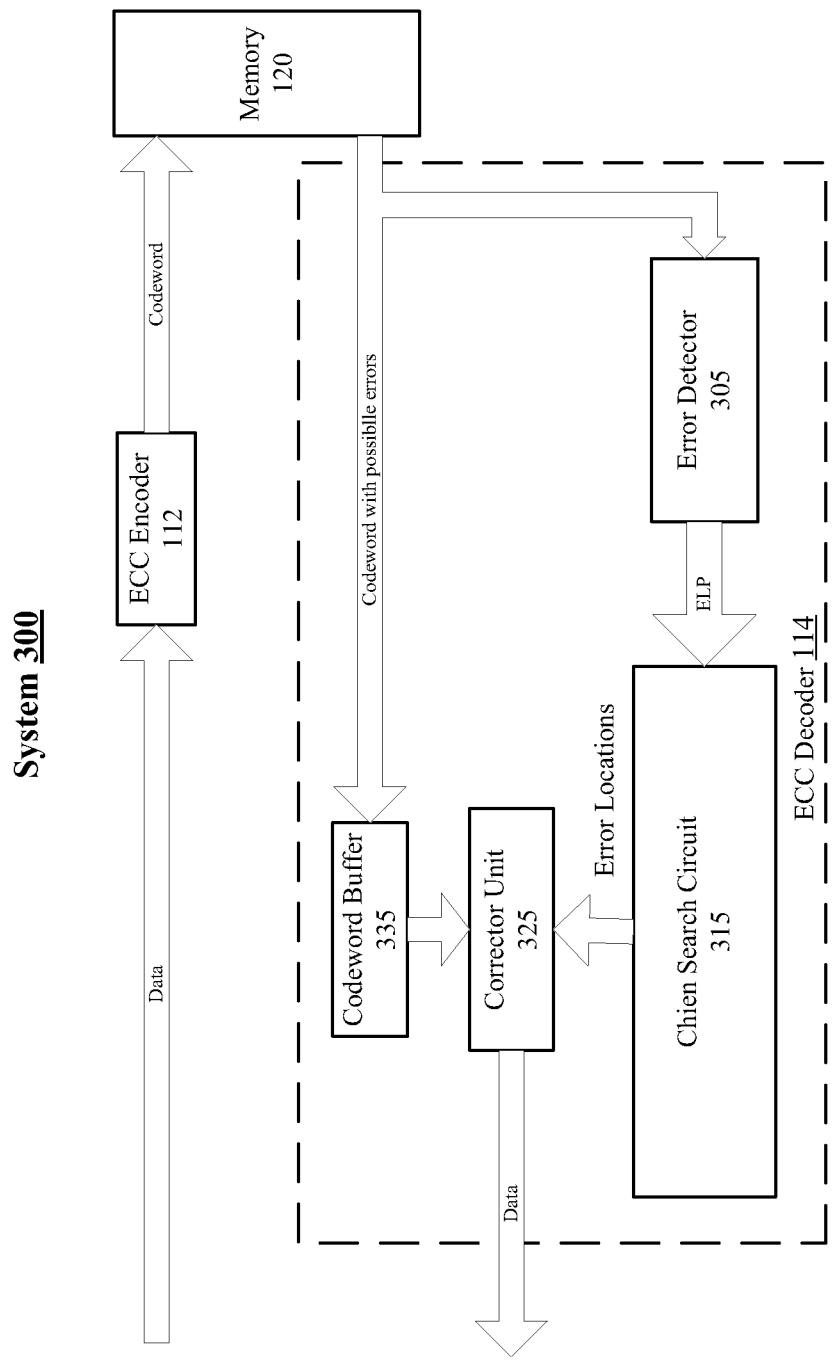
FIG. 3 illustrates an example third system.

FIG. 3 illustrates an example third system. As shown in FIG. 3, the example third system includes system 300. In some examples, system 300 includes ECC encoder 112, memory 120 and ECC decoder 114. Also, ECC decoder 114 is shown as including an error detector 305, Chien search circuit 315, a corrector unit 325 and a codeword buffer 335.

In some examples, data (possibly encrypted/compressed) may be encoded by ECC encoder 112 using an ECC code that may include binary BCH codes or RS codes. The resultant codeword may then be stored to memory 120.

According to some examples, the stored codeword may be read from memory 120 and may include possible errors. As shown in FIG. 3, the codeword with possible errors may be forwarded to codeword buffer 335. Codeword buffer 335 may be configured to at least temporarily store the codeword while other elements of ECC decoder 114 identify a location and/or a value for each error possibly included in the codeword.

According to some examples, error detector 305 may be configured to determine if the codeword includes any errors. For these examples, if no errors are detected, ECC decoder 114 may include logic and/or features to indicate to corrector unit 325 or codeword buffer 335 to forward the codeword being stored at codeword buffer 335. However, if errors are detected, error detector 305 may calculate partial syndromes associated with an error locator polynomial (ELP) with a given degree that indicates a maximum number of possible errors for the ECC encoded data. The ELP with the given degree may then be forwarded to Chien search circuit 315. Roots for the ELP may be identified and error locations may be found by Chien search circuit 315.

In some examples, as shown in FIG. 3, error locations may be provided to corrector unit 325 from Chien search circuit 315. For these examples, corrector unit 325 may be configured to correct identified errors based on the error locations. Corrector unit 325 may also be configured to decode the codeword and then forward the data for possible decompression/decryption and eventual delivery to the source of the read request.

Figure 4:
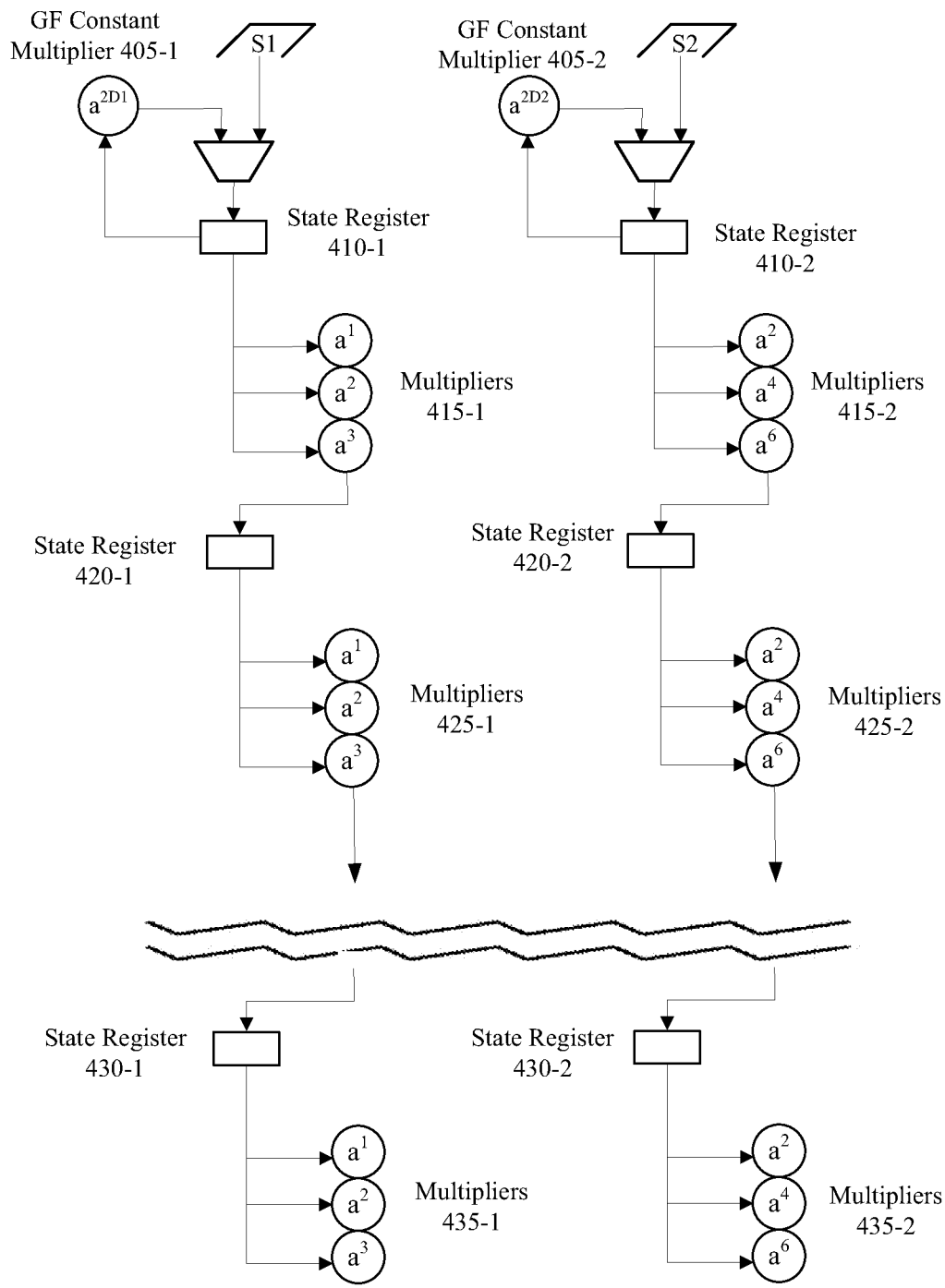
FIG. 4 illustrates an example first layout.

FIG. 4 illustrates an example first layout. As shown in FIG. 4, the first layout includes layout 400. In some examples, as shown in FIG. 4, layout 400 may be for an example layout for a portion of a Chien search circuit. For these examples, the portion may include 2 columns of a Chien search circuit to evaluate partial syndromes associated with an ELP. These 2 columns of example layout 400 may include Galois field (GF) constant multipliers 405-1, 405-2 and state registers 410-1, 410-2, 420-1, 420-2, 430-1 and 430-2. The 2 columns of example layout 4 may also include multipliers 415-1, 415-2, 425-1, 425-2, 435-1 and 435-2. Examples are not limited to example layout 400. Other examples, having more or less columns and more or less groups of multipliers are contemplated. The jagged parallel lines between multipliers 425-1/2 and 435-1/2 indicate these other possible examples.

According to some examples, layout 400 shown in FIG. 4 may be an example layout that reduces possible fanout requirements for a state register used in a Chien search circuit. A method chosen to reduce possible fanout requirements may be chosen because the method may coincide with a mathematical optimization. For example, assume that a decoder (e.g., decoder 114) operates on D bits at a time, and that D may be factored into D1 and D2. Looking at a single column 1 of a parallel circuit, the following multiplications as shown in example equation (1) may be required.

$$(x\alpha^l, x\alpha^{2l}, x\alpha^{3l}, \ldots, x\alpha^{Dl}) \qquad \text{Example Equation (1):}$$

Dividing the set of multipliers shown in example equation 1 into D2 groups of size D1, example equation (1) can be rewritten as example equation (2):

$$\begin{aligned}
&(x\alpha^l, x\alpha^{2l}, x\alpha^{3l}, \ldots, x\alpha^{D_1 l}), x \\
&\alpha^{D_1 l}(x\alpha^l, x\alpha^{2l}, x\alpha^{3l}, \ldots, x\alpha^{D_1 l}), x\alpha^{2D_1 l} \\
&(x\alpha^l, x\alpha^{2l}, x\alpha^{3l}, \ldots, x\alpha^{D_1 l}), x\alpha^{3D_1 l} \\
&(x\alpha^l, x\alpha^{2l}, x\alpha^{3l}, \ldots, x\alpha^{D_1 l}), \ldots x \\
&\alpha^{(D_2-1)D_1 l}(x\alpha^l, x\alpha^{2l}, x\alpha^{3l}, \ldots, x\alpha^{D_1 l})
\end{aligned} \qquad \text{Example Equation (2)}$$

For example equation (2), in each group, a common factor may be removed from the set of multipliers. A state for this group's duplicated register needs to be premultiplied by this common factor. However, if each group sources its input from the last multiplier from a proceeding group, all common factors may be accounted for. Thus, as shown in FIG. 4, inputs for multipliers 425-1 and 425-2 are received from respective last multipliers from multipliers 415-1 and 415-2. Also, inputs for multipliers 435-1 and 435-2 are received from respective last multipliers from multipliers 425-1 and 425-2.

Advantages of the above-mentioned optimization may be two-fold. First, it accomplishes register duplication (in an indirect way) that may help to reduce fanout from state registers. Second, it allows a same set of GF constants to be used by all groups of polynomial coefficients associated with a received ELP. Allowing for the same set of GF constants may reduce design complexity for the Chien search circuit and also allows for specific GF constants to be selected that may further reduce design complexity.

Figure 5:
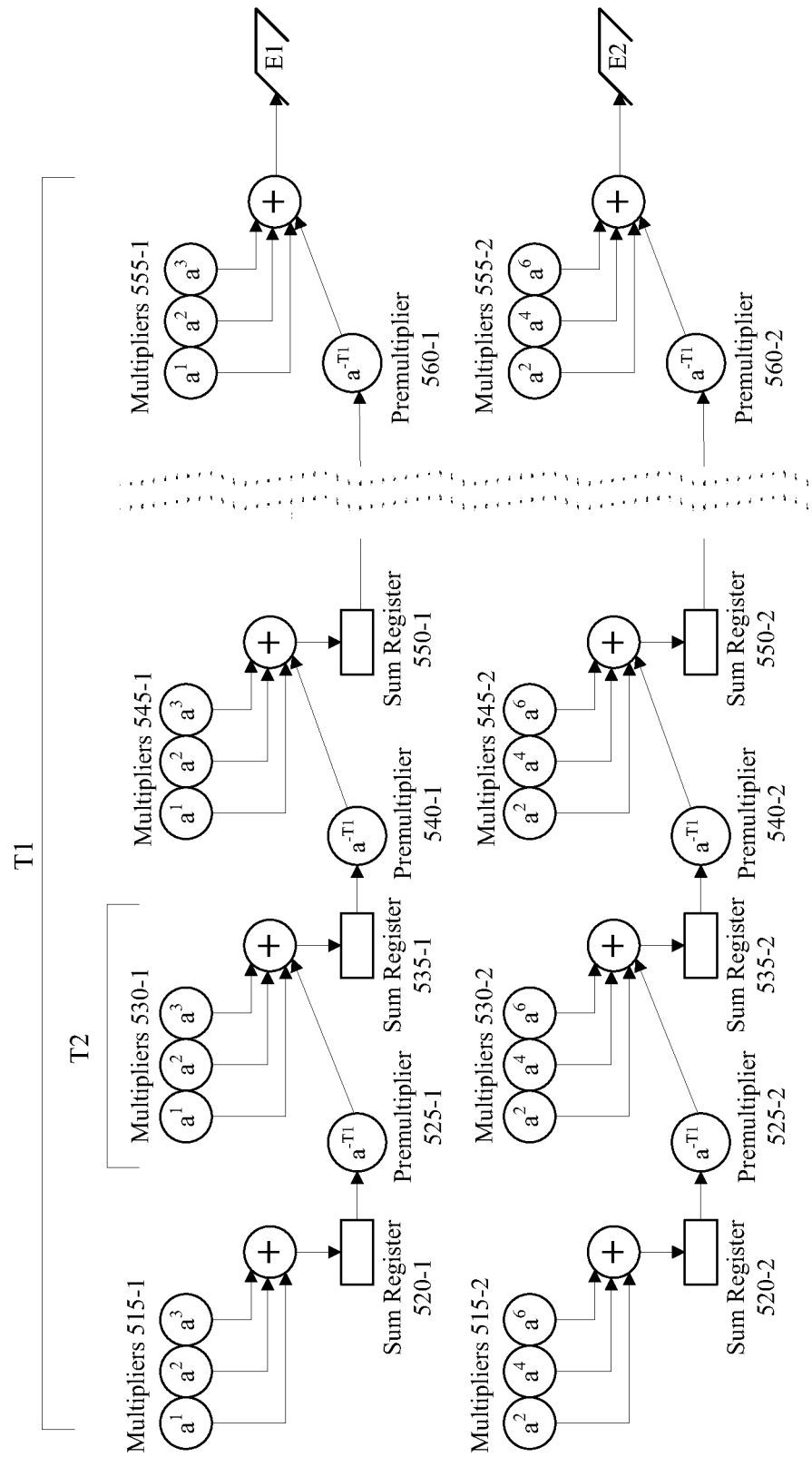
FIG. 5 illustrates an example second layout.

FIG. 5 illustrates an example second layout. As shown in FIG. 5, the second layout includes layout 500. In some examples, as shown in FIG. 5, layout 500 may be an example layout for a portion of a Chien search circuit. For these examples, the portion may include 2 rows of a Chien search circuit, each row having a total of T1 groupings of T2 processing units. The processing units may separately include multiple multipliers, a summer to sum outputs and a sum register to at least temporarily store sums. Other than the first processing units of a given row, a premultiplier may also be included in the units to premultipy a sum value maintained in a sum register.

In some examples, layout 500 may be an example were T1 equals 4 to represent four processing units and T2 equals 3 to represent three multipliers for each processing unit. As shown in FIG. 5, example layout 500 has multipliers 515-1, 515-2, 530-1, 530-2, 545-1, 545-2, 555-1 and 555-2. Example layout 500 also has sum registers 520-1, 520-2, 535-1, 535-2, 550-1 and 550-2. Example layout 500 also has premultipliers 525-1, 525-2, 540-1, 540-2, 560-1 and 560-2. As described more below, these multipliers, sum registers and premultipliers may be arranged to allow for an intermediate sum optimization that simplifies design and/or use of a Chien search circuit to locate errors 1 (E1) and 2 (E2) in ECC encoded data. Examples are not limited to example layout 500. Other examples, having more or less rows and more or less multipliers in each processing unit are contemplated. The dashed parallel lines between multipliers 555-1 and 555-2 indicate these other possible examples.

According to some examples, layout 500 may accomplish two elements. First, sum registers such as sum registers 535-1, 535-2, 550-1 and 550-2 may be inserted to collect intermediate sums outputted from their respective multipliers. This may result in a break in possibly long fanin paths from state registers to sum registers. Second, since not all GF constant multipliers require the same resources, the sum equations may be broken down and modified, such that an overall reduction in resources used by constant multiplication is achieved. Assume that a decoder (e.g., decoder 114) can correct up to T bits of error, and that T may be factored into T1 and T2. Looking at a single row r of layout 500, a sum depicted in example equation (3) may be required:

$$S_1 \alpha^r + S_2 \alpha^{2r} + S_3 \alpha^{3r} + \ldots + S_t \alpha^{tr} \quad \text{Example equation (3):}$$

Dividing the set of terms into T2 groups of size T1, example equation (3) can be rewritten as example equation (4):

$$S_1 \alpha^r + S_2 \alpha^{2r} + S_3 \alpha^{3r} + \ldots +$$
$$S_{T_1} \alpha^{T_1 r} + S_{(T_1+1)} \alpha^{(T_1+1)r} + S_{(T_1+2)} \alpha^{(T_1+2)r} + S_{(T_1+3)} \alpha^{(T_1+3)r} + \ldots +$$
$$S_{2T_1} \alpha^{2T_1 r} + S_{(2T_1+1)} \alpha^{(2T_1+1)r} + S_{(2T_1+2)} \alpha^{(2T_1+2)r} + S_{(2T_1+3)} \alpha^{(2T_1+3)r} + \ldots +$$
$$S_{3T_1} \alpha^{3T_1 r} + \ldots$$

By removing powers of $\alpha^{(T_1+2)r}$ from the preceding equations, example equation (4) can be rewritten as example equation (5):

$$S_1 \alpha^r + S_2 \alpha^{2r} + S_3 \alpha^{3r} + \ldots + S_{T_1} \alpha^{T_1 r}$$
$$\alpha^{T_1 r} (S_{(T_1+1)} \alpha^r + S_{(T_1+2)} \alpha^{2r} + S_{(T_1+3)} \alpha^{3r} + \ldots + S_{2T_1} \alpha^{T_1 r})$$
$$\alpha^{2T_1 r} (S_{(2T_1+1)} \alpha^r + S_{(2T_1+2)} \alpha^{2r} + S_{(2T_1+3)} \alpha^{3r} + \ldots + S_{3T_1} \alpha^{T_1 r})$$
$$\ldots$$

In some examples, multipliers may need to be added between the groups of sums to account for the power of $\alpha^{T_1 r}$ that were factored out as indicated above. An additional improvement can be made here. By collecting the parenthetical expressions in reverse order, then multiplying each by $\alpha^{T_1 r}$ before adding it to the previous parenthetical expression, and continuing until the first expression, the sums above can be calculated while using only $\alpha^{T_1 r}$ multipliers. The higher powers may be accounted for by the condition that expressions which need multiplication by powers of $\alpha^{T_1 r}$ may be fed through multiple multipliers.

According to some examples, the optimization described thus far by example equations (4) and (5) may require that higher order terms from sigma(x) be available prior to lower order terms from sigma(x) or conversely, that lower order terms need to be buffered somewhere to account for requisite delays. This requirement may be undesirable, as the preceding block that generates sigma(x) may do so from least significant to most significant. Example equation (5) may be modified once again to reverse the requirement.

In some examples, since each of the sums above for example equation (5) is compared to 0, the sum may be multiplied by any constant, and the comparison may still be valid. Multiplying the above equations each by $\alpha^{-T_1 T_2 r}$ may result in the following new example equations:

$$\alpha^{T_1 T_2 r} \alpha^{-T_1 T_2 r} (S_1 \alpha^r + S_2 \alpha^{2r} + S_2 \alpha^{2r} + S_3 \alpha^{3r} + \ldots + S_{T_1} \alpha^{T_1 r}) \quad \text{Example equation (6):}$$

$$\alpha^{-T_1(T_2-1)r} (S_{(T_1+1)} \alpha^{2r} + S_{(T_1+3)} \alpha^{3r} + \ldots + S_{2T_1} \alpha^{T_1 r}) \quad \text{Example equation (7):}$$

$$\alpha^{-T_1(T_2-2)r} (S_{(2T_1+1)} \alpha^r + S_{(2T_1+2)} \alpha^{3r} + S_{(2T_1+3)} \alpha^{3r} + \ldots + S_{3T_1} \alpha^{T_1 r}) \quad \text{Example equation (8):}$$

Note that the $\alpha^{T_1 T_2 r}$ terms may be ignored for a Chien search circuit that includes columns depicted in layout 500. The above example equations (6)-(8) may now allow for a Chien search circuit that may require lower order terms of sigma(x) first. In some examples, instead of multiplying each parenthetical sum by $\alpha^{T_1 r}$, each sum may be multiplied by $\alpha^{-T_1 r}$.

According to some examples, as described more below, two rows shown in FIG. 5 for example layout 500 may be included in a systolic array of processing units for a Chien search circuit that may be designed to implement the above-mentioned sum optimization.

Figure 6:
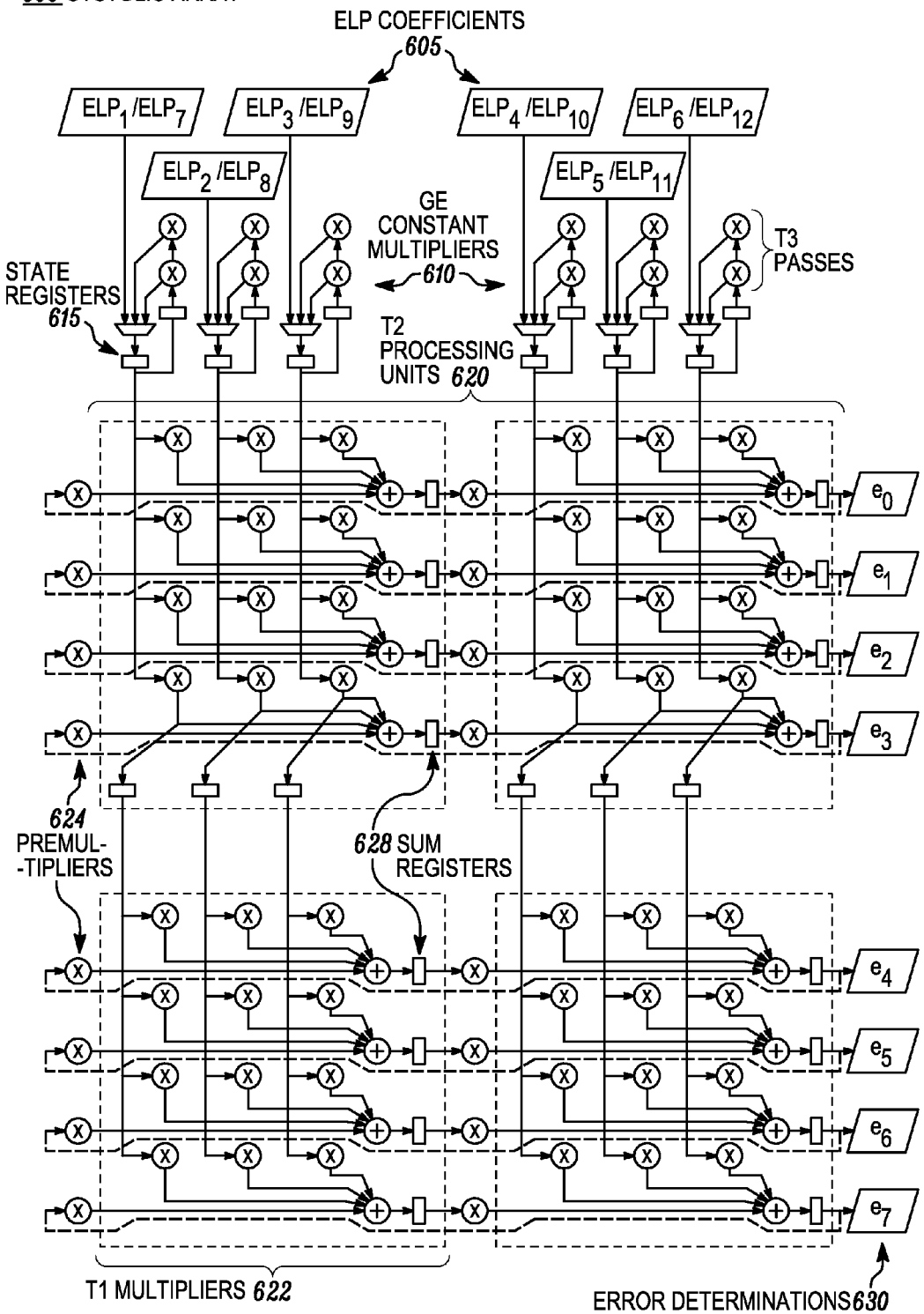
FIG. 6 illustrates an example systolic array.

FIG. 6 illustrates an example systolic array 600. In some examples, systolic array 600 may include elements of example layouts 400 and 500. As shown in FIG. 6, systolic array 600 may include a set of four processing units 620 (T2=2, D2=2) each having three multipliers per row (T1=3) and four multipliers per column (D1=4). Also shown in FIG. 6 are two sets of GF constant multipliers 610 (T3=2) that may enable ELP coefficients 605 to be evaluated to reach error determinations 630.

According to some examples, systolic array 600 may be used as a Chien search circuit to find T roots for an ELP associated with errors identified in ECC encoded data. For these examples, T may include factors T1, T2 and T3. T1*T2 may equal a number of roots identified for a single pass through the Chien search circuit and T3 may equal a number of passes before all T roots can be found. So for systolic array 600, where T1=3 and T2=2 the number of roots possibly identified for the single pass would be 3*2=6. Also, since T3=2 a total of 6*2=12 roots may be found using systolic array 600.

In some examples, as shown in FIG. 6, systolic array 600 may include a plurality or multitude of processing units 620. For these examples, each processing unit may have at least two rows with each row having a plurality of multipliers 622 to sum outputs with an output from premultipliers 624 as shown in FIG. 6. The summed outputs may then be stored to respective separate sum registers 628. Also, for the first row of processing units 620, each first multiplier of a given same column may receive an input from a given state register from among state registers 615. State registers 615 may each be arranged to store a given output from a given GF multiplier from among GF constant multipliers 610 that may be used to locate a given root (e.g., using ELP coefficients 605) from among T possible roots for the ELP. For the second row of processing units 620, each multiplier of a given same column may receive an input from a last given multiplier from among the processing units of the first row. The output from the last given multiplier thus may duplicate the input from the given state register in a similar manner as described above for layout 400.

According to some examples, the summed outputs stored to sum registers 628 for the first or left side column processing units may be inputted to premultipliers 624 for the second or right side column processing units. Also, as indicated by the dashed lines for sum registers 628 for the right side column processing units, summed outputs may be inputted to premultipliers for the left side column processing units for subsequent passes through the Chien search circuit.

In some examples, the first pass through the Chien search circuit may include use of a first set of GF constants, each separately associated with given state registers 615 arranged to store the given output from GF constant multipliers 610. The second pass through the Chien search circuit may include use of a second set of GF constants, each separately associated with the given state registers 615 arranged to store another given output from another given GF field constant multiplier 610 used to locate another given root from among the T roots for the ELP having ELP coefficients 605.

According to some examples, ELP coefficients 605 may represent coefficients of an ELP that may indicate a maximum number of error locations for ECC encoded data, e.g., as determined by a Berlekamp-Massey algorithm (BMA) implemented by logic and/or features of a decoder. Also each error determination of error determinations 630 may indicate a given location of an error output by the Chien search circuit implemented by the elements of systolic array 600.

Systolic array 600 includes one example of a type of systolic array that may be configured to implement a Chien search circuit to locate errors. Systolic arrays having additional columns and rows of processing units 620 that may also have more or less multipliers are also contemplated. Thus, examples are not limited to the 2 by 2 systolic array depicted in FIG. 6 for systolic array 600.

Figure 7:
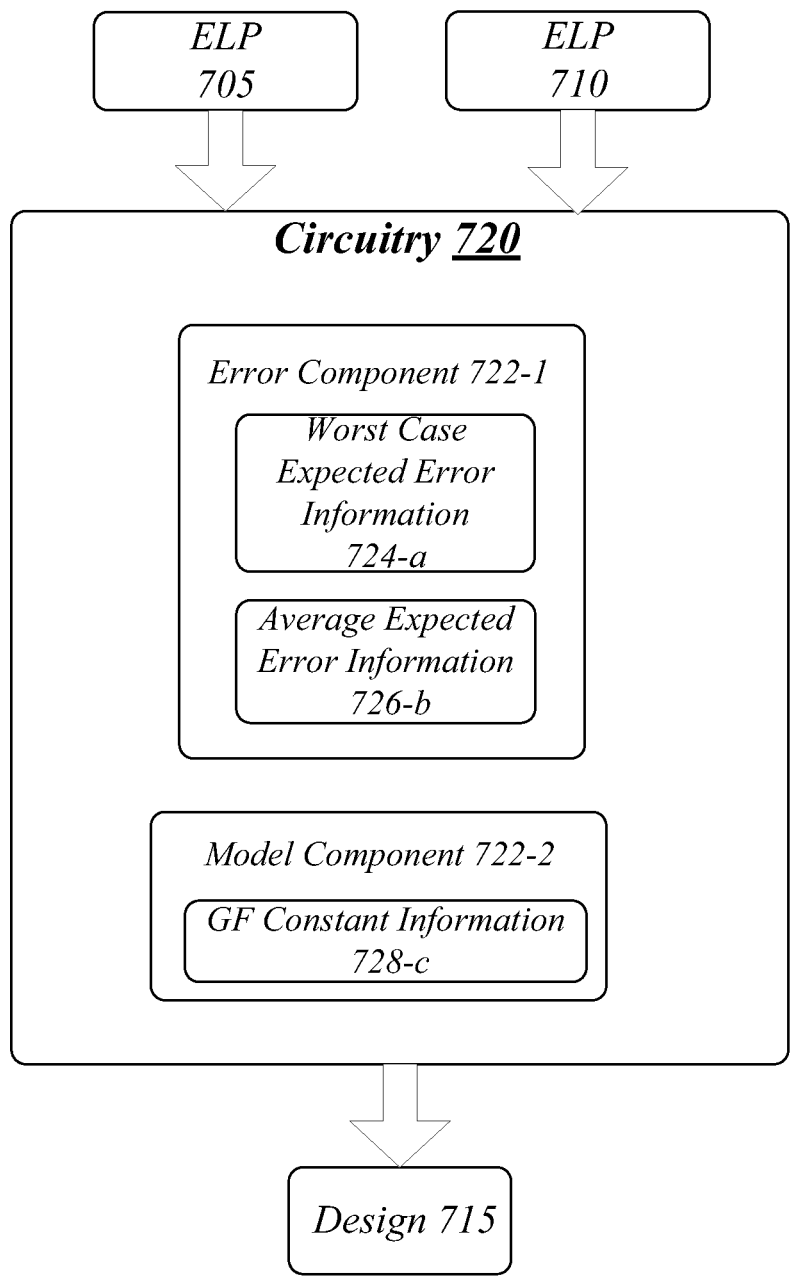
FIG. 7 illustrates an example apparatus.

FIG. 7 illustrates an example apparatus 700. Although the apparatus 700 shown in FIG. 7 has a limited number of elements in a certain topology, it may be appreciated that the apparatus 700 may include more or less elements in alternate topologies as desired for a given implementation.

The apparatus 700 may comprise a computer-implemented apparatus that may be used to model a design for a Chien search circuit arranged as mentioned above for FIGS. 4-6. The computer-implemented apparatus 700 may be arranged to execute one or more software components 722-$a$. It is worthy to note that "a" and "b" and "c" and similar designators as used herein are intended to be variables representing any positive integer. Thus, for example, if an implementation sets a value for a=2, then a complete set of software components 722-$a$ may include components 722-1 or 722-2. The examples are not limited in this context.

In some examples, if implemented apparatus 700 is implemented in a processor, the processor may be generally arranged to execute one or more software components 722-$a$. The processor can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel®, Atom Celeron®, Core (2) Duo®, Core i3, Core i5, Core i7, Pentium®, Xeon®, Xeon Phi®, Itanium® and XScale® processors; and similar processors. Multi-core processors and other multi-processor architectures may also be employed to implement apparatus 700.

According to some examples, apparatus 700 may include an error component 722-1. Error component 722-1 may be executed by circuitry 720 to determine, for a memory system, a worst case number of errors for ECC encoded data for which a Chien search circuit associated with a decoder for the memory system is to locate errors based on a received ELP having a degree T that indicates error locations for the worst case number of errors. Error component 722-1 may also be capable of determining an average expected number of errors for the ECC encoded data that may be a fraction of T. For these examples, error component 722-1 may be capable of maintaining information to determine worst case expected errors in worst case expected error information 724-$a$ and information to determine average expected errors in average expected error information 726-$b$. Worst case expected error information 724-1 and average expected error information 726-$b$ may be maintained in a data structure such as a lookup table (LUT).

In some examples, information included in worst case expected error information 724-$a$ and average expected error information 726-$b$ may be based on a particular usage case and/or types of memory included in the memory system deploying the Chien search circuit. For example, the memory system may be associated with a memory caching system that may include various types of non-volatile memory such as flash memory. Information included in worst case expected error information 724-$a$ and average expected error information 726-*b* may include information such as an expected lifetime usage of the flash memory and expected frequency of access to/from memory arrays or devices included in the flash memory. Since flash memory typically becomes more error-prone with long-term usage and/or frequent read/write accesses, longer expected lifetime (e.g., several years) usages along with higher frequency of access to/from the memory arrays may result in error component 722-1 determining a relatively high number of worst case expected errors. Alternatively, if the flash memory has a relatively short expected lifetime (e.g., 1 or 2 years), and/or is infrequently accessed and/or powered off for extended periods, error component 722-1 may determine a relatively low number of worst case expected errors. Information included in average expected errors 726-*b* for average expected errors may account for the expected lifetime and frequencies of access to enable error component 722-1 to determine an average error rate.

In some examples, apparatus 700 may also include a model component 722-2. Model error component 722-2 may be executed by circuitry 720 to model a design for the Chien search circuit based on various GF constants that may be used by the Chien search circuit to identify first roots for a first received ELP (e.g., ELP 705) having a first degree that equals the fraction of T to locate errors for the average expected number of errors in a single pass through the Chien search circuit. Model component 722-2 may also model the design to identify second roots for a second received ELP (e.g., ELP 710) having the degree T to locate errors for the worst case number of errors in multiple passes through the Chien search circuit.

According to some examples, T may include factors T1, T2 and T3, where T1 equates to a number of columns of multipliers that may be separately included in respective T2 processing units included in a plurality of processing units for the modeled Chien search circuit design. For these examples, T1\*T2 may equal a first number of roots the modeled Chien search circuit design may be capable of identifying in the single pass. The identified roots may then be used to locate errors for the average expected number of errors. Also, T1\*T2\*T3 may equal a second number of roots the modeled Chien search circuit design may be capable of identifying in T3 passes to locate errors for the worst case number of errors.

An example of a modeled Chien search circuit for T that includes factors T1, T2 and T3 may be the Chien search circuit implemented by systolic array 600 described above for FIG. 6. For systolic array 600, T1=3, T2=2 and T3=2. So for this example Chien search circuit, the average expected number of errors may by 2\*3=6 errors and the worst case expected errors may be 2\*3\*2=12.

In some examples, model component 722-2 may be capable of maintaining GF constant information 728-*c* (e.g., in a LUT). GF constant information 728-*c* may include information for various GF constants that may be used to model a design for the Chien search circuit such that a single pass through the modeled Chien search circuit design includes use of a set of GF constants that may have been determined to have a lower combinatorial complexity. Also, subsequent passes through the modeled Chien search circuit design may include use of different sets of GF constants. These different sets may have also been determined to have a lower combination complexity. GF constant information 728-*c* may include selected sets of GF constants and these selected sets may determine values for T1, T2 or T3 of the modeled Chien search circuit design to generate design 715.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

FIG. 8 illustrates a logic flow 800. Logic flow 800 may be representative of some or all of the operations executed by one or more logic, features, or devices described herein, such as apparatus 700. More particularly, logic flow 800 may be implemented by error component 722-1 or design component 722-2.

According to some examples, logic flow 800 at block 802 may determine, for a memory system, a worst case number of errors for ECC encoded data for which a Chien search circuit associated with a decoder for the memory system is to locate errors based on a received ELP having a degree T that indicates error locations for the worst case number of errors. In some examples, error component 722-1 may be capable of determining the worst case number of errors.

In some examples, logic flow 800 at block 804 may determine an average expected number of errors for the ECC encoded data that is a fraction of T. For these examples, error component 722-1 may also be capable of determining the average expected number of errors.

According to some examples, logic flow 800 at block 806 may model a design for the Chien search circuit based various Galois field constants that are to be used by the Chien search circuit to identify first roots for a first received ELP having a first degree that equals the fraction of T to locate errors for the average expected number of errors in a single pass through the Chien search circuit. Logic flow 800 at block 806 may also identify second roots for a second received ELP having the degree T to locate errors for the worst case number of errors in multiple passes through the Chien search circuit. For these examples, model component 722-2 may be capable of modeling the design for the Chien search circuit.

FIG. 9 illustrates an embodiment of a storage medium 900. The storage medium 900 may comprise an article of manufacture. In some examples, storage medium 900 may include any non-transitory computer readable medium or machine readable medium, such as an optical, magnetic or semiconductor storage. Storage medium 900 may store various types of computer executable instructions, such as instructions to implement logic flow 800. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

FIG. 10 illustrates an example computing device 1000. In some examples, as shown in FIG. 10, computing device 1000 may include a processing component 1040, other platform components 1050 or a communications interface 1060.

According to some examples, processing component 1040 may execute processing operations or logic for apparatus 700 and/or storage medium 900. Processing component 1040 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 1050 may include common computing elements, such as one or more processors, multi-core processors, co-processors, memory units, chipsets, controllers, peripherals, interfaces, oscillators, timing devices, video cards, audio cards, multimedia input/output (I/O) components (e.g., digital displays), power supplies, and so forth. Examples of memory units associated with either other platform components 1050 may include without limitation, various types of computer readable and machine readable storage media in the form of one or more higher speed memory units, such as ROM, RAM, DRAM, Double-Data-Rate DRAM (DDRAM), synchronous DRAM (SDRAM), SRAM, programmable ROM (PROM), EPROM, EEPROM, NAND flash memory, NOR flash memory, polymer memory such as ferroelectric polymer memory, ferroelectric transistor random access memory (FeTRAM or FeRAM), nanowire, ovonic memory, ferroelectric memory, 3-dimentional cross-point memory, SONOS memory, magnetic or optical cards, an array of devices such as Redundant Array of Independent Disks (RAID) drives, solid state memory devices (e.g., USB memory), SSDs and any other type of storage media suitable for storing information.

In some examples, communications interface 1060 may include logic and/or features to support a communication interface. For these examples, communications interface 1060 may include one or more communication interfaces that operate according to various communication protocols or standards to communicate over direct or network communication links. Direct communications may occur via use of communication protocols or standards described in one or more industry standards (including progenies and variants) to include the Peripheral Component Interconnect (PCI) Express Base Specification, revision 3.0, published in November 2010 ("PCI Express" or "PCIe"), the Universal Serial Bus Specification, revision 3.0, published in November 2008 ("USB"), the Serial ATA (SATA) Specification, revision 3.1, published in July 2001, Request for Comments (RFC) 3720, Internet Small Computer System Interface (iSCSI), published in April 2004 and/or the Serial Attached SCSI (SAS) Specification, revision 2.1, published in December 2010. Network communications may occur via use of various communication protocols and may operate in compliance with one or more promulgated standards or specifications for wired or wireless networks by the Institute of Electrical Engineers (IEEE). These standards are specifications may include, but are not limited to, IEEE 802.11-2012 Standard for Information technology—Telecommunications and information exchange between systems—Local and metropolitan area networks—Specific requirements Part 11:WLAN Media Access Controller (MAC) and Physical Layer (PHY) Specifications, published March 2012, later versions of this standard ("IEEE 802.11") for wireless mediums or IEEE 802.3-2008, Carrier sense Multiple access with Collision Detection (CSMA/CD) Access Method and Physical Layer Specifications, Published in December 2008 (hereinafter "IEEE 802.3") for wired mediums, one or more protocols that may encapsulate Fibre Channel frames over Ethernet networks referred to as fiber channel over Ethernet (FCoE), compatible with the protocols described by the American National Standard of Accredited Standards Committee INCITS T11 Technical Committee, Fibre Channel Backbone-5 (FC-BB-5) Standard, Revision 2.0, published June 2009 and/or protocols associated with RFC 3530, Network File System (NFS), version 4 Protocol, published in April 2003.

Computing device 1000 may be part of a system or device that may be, for example, user equipment, a computer, a personal computer (PC), a desktop computer, a laptop computer, a notebook computer, a netbook computer, a tablet computer, a tablet, a portable gaming console, a portable media player, a smart phone, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing device 1000 described herein, may be included or omitted in various embodiments of computing device 1000, as suitably desired.

The components and features of computing device 1000 may be implemented using any combination of discrete circuitry, application specific integrated circuits (ASICs), logic gates and/or single chip architectures. Further, the features of computing device 1000 may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It should be appreciated that the exemplary computing device 1000 shown in the block diagram of FIG. 10 may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in embodiments.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method comprising:

receiving, by a memory caching device, an error locator polynomial (ELP) having a degree indicating a number of error locations for error correction code (ECC) encoded data;

determining, by the memory caching device, when the number of error locations is less than an established threshold;

generating, by the memory caching device, one or more roots for the ELP in a single pass through a plurality of processing units included in a Chien search circuit, when the determining indicates that the number of error locations is less than the established threshold; and identifying, by the memory caching device, one or more of the number of error locations in the ECC encoded data using one or more of the roots for the ELP.

2. The method of claim 1, further comprising using, by the memory caching device, a set of Galois field constant multipliers during the single pass through the plurality of processing units included in the Chien search circuit.

3. The method of claim 1, wherein the ECC comprises one of a Reed-Solomon (RS) code or a binary Bose, Chaudhuri, and Hocquenghem (BCH) code.

4. The method of claim 1, further comprising generating, by the memory caching device, the one or more roots for the ELP in multiple passes through the plurality of processing units included in the Chien search circuit, when the determining indicates that the number of error locations is not less than the established threshold.

5. An apparatus, comprising
a memory controller containing machine readable medium comprising machine executable code having stored thereon instructions for performing a method of locating errors for error correction code (ECC) encoded data; and
a processor coupled to the memory, the processor configured to execute the machine executable code to cause the processor to:
receive an error locator polynomial (ELP) having a degree indicating a number of error locations for error correction code (ECC) encoded data;
determine when the number of error locations is less than an established threshold;
generate one or more roots for the ELP in a single pass through a plurality of processing units included in a Chien search circuit, when the determining indicates that the number of error locations is less than the established threshold; and
identify one or more of the number of error locations in the ECC encoded data using one or more of the roots for the ELP.

6. The apparatus of claim 5, wherein the processor is further configured to execute the machine executable code to cause the processor to use a set of Galois field constant multipliers during the single pass through the plurality of processing units included in the Chien search circuit.

7. The apparatus of claim 5, wherein the ECC comprises one of a Reed-Solomon (RS) code or a binary Bose, Chaudhuri, and Hocquenghem (BCH) code.

8. The apparatus of claim 5, wherein the processor is further configured to execute the machine executable code to cause the processor to generate the one or more roots for the ELP in multiple passes through the plurality of processing units included in the Chien search circuit, when the determining indicates that the number of error locations is not less than the established threshold.

9. A non-transitory machine readable medium having stored thereon instructions for performing a method comprising machine executable code which when executed by a processor, causes the processor to:
receive an error locator polynomial (ELP) having a degree indicating a number of error locations for error correction code (ECC) encoded data;
determine when the number of error locations is less than an established threshold;
generate one or more roots for the ELP in a single pass through a plurality of processing units included in a Chien search circuit, when the determining indicates that the number of error locations is less than the established threshold; and
identify one or more of the number of error locations in the ECC encoded data using one or more of the roots for the ELP.

10. The non-transitory machine readable medium of claim 9, wherein the machine executable code, when executed by the processor, further causes the processor to use a set of Galois field constant multipliers during the single pass through the plurality of processing units included in the Chien search circuit.

11. The non-transitory machine readable medium of claim 9, wherein the ECC comprises one of a Reed-Solomon (RS) code or a binary Bose, Chaudhuri, and Hocquenghem (BCH) code.

12. The non-transitory machine readable medium of claim 9, wherein the machine executable code, when executed by the processor, further causes the processor to generate the one or more roots for the ELP in multiple passes through the plurality of processing units included in the Chien search circuit, when the determining indicates that the number of error locations is not less than the established threshold.

* * * * *